(12) United States Patent
Mayer (10) Patent No.: US 6,840,388 B2
(45) Date of Patent: Jan. 11, 2005

(54) TOOL-LESS RACK MOUNTING SYSTEM (75) Inventor: David W. Mayer, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/282,807

(22) Filed: Oct. 28, 2002

(65) Prior Publication Data

US 2004/0079712 A1 Apr. 29, 2004

(51) Int. Cl.[7] .................................................. A47F 7/00
(52) U.S. Cl. ........................................................ 211/26
(58) Field of Search ................ 211/26, 191; 312/265.1, 312/334.5

(56) References Cited

U.S. PATENT DOCUMENTS

| | | | | |
|---|---|---|---|---|
| 5,791,498 A | * | 8/1998 | Mills | 211/26 |
| 5,833,337 A | * | 11/1998 | Kofstad | 312/334.5 |
| 6,230,903 B1 | * | 5/2001 | Abbott | 211/26 |
| 6,305,556 B1 | * | 10/2001 | Mayer | 211/26 |
| 6,422,399 B1 | * | 7/2002 | Castillo et al. | 211/26 |
| 6,431,668 B1 | * | 8/2002 | Reddicliffe | 312/334.5 |
| 6,435,354 B1 | * | 8/2002 | Gray et al. | 211/26 |
| 6,523,918 B1 | * | 2/2003 | Baiza | 211/26 |
| 6,615,992 B1 | * | 9/2003 | Lauchner et al. | 211/26 |
| 6,622,873 B2 | * | 9/2003 | Hegrenes et al. | 211/26 |
| 6,659,577 B2 | * | 12/2003 | Lauchner | 312/334.5 |

* cited by examiner

Primary Examiner—Hugh B. Thompson, II
Assistant Examiner—Sarah Purol
(74) Attorney, Agent, or Firm—Kevin M. Hart (57) ABSTRACT

A tool-less rack mounting system includes a grooved bullet attached to a flange on the end of a slide rail assembly. The bullet protrudes through a clearance hole formed on a corner post of a rack. A hand-releasable clip engages the groove, retaining the bullet in the clearance hole and retaining the flange against the post. The clip may be mounted to a bracket, and the bracket may include features for securing equipment in the rack. A hinged cable management arm may be mounted to the post and to the slide rail assembly without using tools. A flange on one end of the arm includes a clearance hole opening into a channel. The channel engages a standoff mounted to one of the rails of the slide rail assembly. A flange on the other end of the arm may be retained against the post by the bullet and the hand-releasable clip.

15 Claims, 9 Drawing Sheets

TOOL-LESS RACK MOUNTING SYSTEM

FIELD OF THE INVENTION

This invention relates to techniques for rack mounting electronic equipment such as computers.

BACKGROUND

Computer enclosures and other types of electronic equipment are sometimes mounted in a vertical rack structure. This technique is referred to as "rack mounting" and is frequently used, for example, with server-type computers that are accessed remotely via a network. Most rack structures for use in rack mounting include four vertical corner posts. Pairs of horizontal slide rail assemblies are attached to the corner posts to create slots or drawers into which the computer enclosures are received. Given the environments in which most rack-mounting structures are deployed, it is a desirable feature to be able to mount slide rail assemblies and the like into the rack structures without having to use tools.

SUMMARY OF THE INVENTION

In a tool-less rack mounting system according to the invention, one or more grooved bullets are attached to a flange on the end of a slide rail assembly. The bullet protrudes through a clearance hole formed on a corner post of a rack so that the groove is disposed on the side of the post opposite the flange. A hand-releasable clip is engaged with the groove, retaining the bullet in the clearance hole and thus retaining the flange against the post.

In another aspect of the invention, the hand-releasable clip may be slidingly mounted to a bracket defining a clearance hole for the bullet. The clip may slide, relative to the bracket, into an open position and into a closed position. When the clip is in the open position, the bullet is able to fit through the bracket clearance hole unimpeded by the clip. But when the clip is in the closed position, the clip engages the groove of the bullet. The bracket may include features for securing a computer enclosure or other piece of electronic equipment in the rack.

In a further aspect of the invention, a hinged cable management arm may be mounted to the corner post and to the slide rail assembly, also without the use of tools: A first end of the cable management arm is provided with a first flange defining a clearance hole for the bullet. A second end of the cable management arm is provided with a second flange defining a clearance hole that opens into a channel. The latter clearance hole is large enough to clear the head of a corresponding standoff mounted to the slide rail assembly, while the channel is large enough to clear a stem of the standoff but not the head. To mount the cable management arm, the clearance hole in the second flange may be slipped over the head of the standoff, and the arm may then be translated or rotated so that the stem of the standoff slides into the channel of the flange. After this has been done, the first flange may be slipped over the guide bullet protruding through the corner post of the rack. Finally, the hand-releasable clip may be engaged with the groove of the bullet, thus retaining both the slide rail assembly and the first end of the cable management arm against the corner post of the rack. The second end of the cable management arm is retained against the slide rail assembly by the engagement of the second flange with the standoff.

DETAILED DESCRIPTION OF THE PREFERRED EMBODIMENTS

Figure 1A:
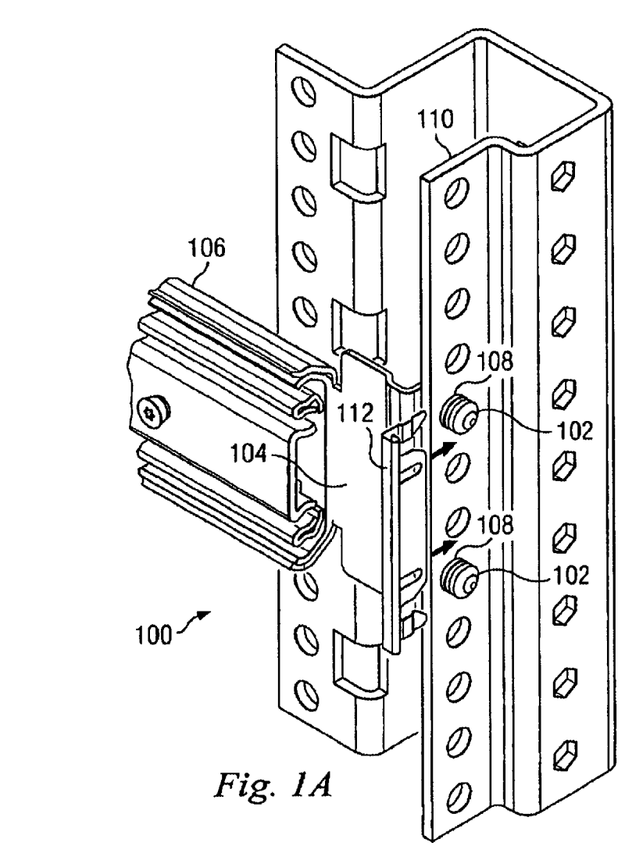
FIGS. 1A and 1B are oblique assembly views illustrating the attachment of a slide rail assembly to a corner post of a rack structure according to a preferred embodiment of the invention.
Figure 1B:
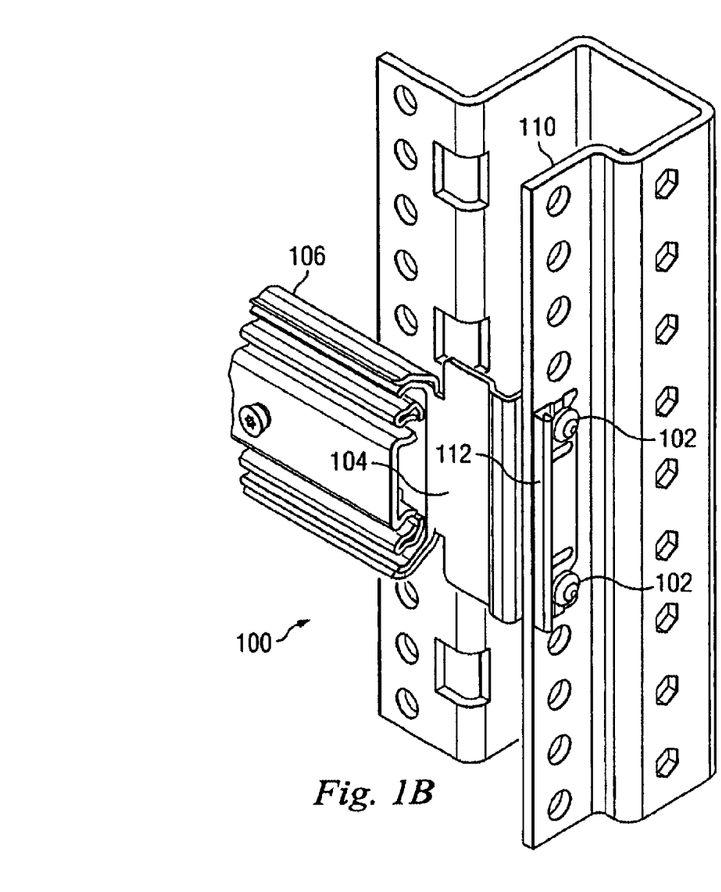

FIGS. 1A and 1B are assembly views illustrating tool-less rack mounting apparatus 100 according to a first preferred embodiment of the invention. One or more grooved bullets 102 are attached to a flange 104 on the end of a slide rail assembly 106. In FIG. 1A, the bullets 102 protrude through corresponding clearance holes 108 formed on a corner post 110 of a rack so that the groove of each bullet 102 is disposed on the side of the post 110 opposite the flange 104. In FIG. 1B, a hand-releasable clip 112 is engaged with the groove of each bullet 102, retaining the guide bullets 102 in the clearance holes 108 and thus retaining the flange 104 against the corner post 110. Although the embodiments illustrated use two bullets per flange, alternative embodiments may employ fewer or more than two bullets per flange.

Figure 2A:
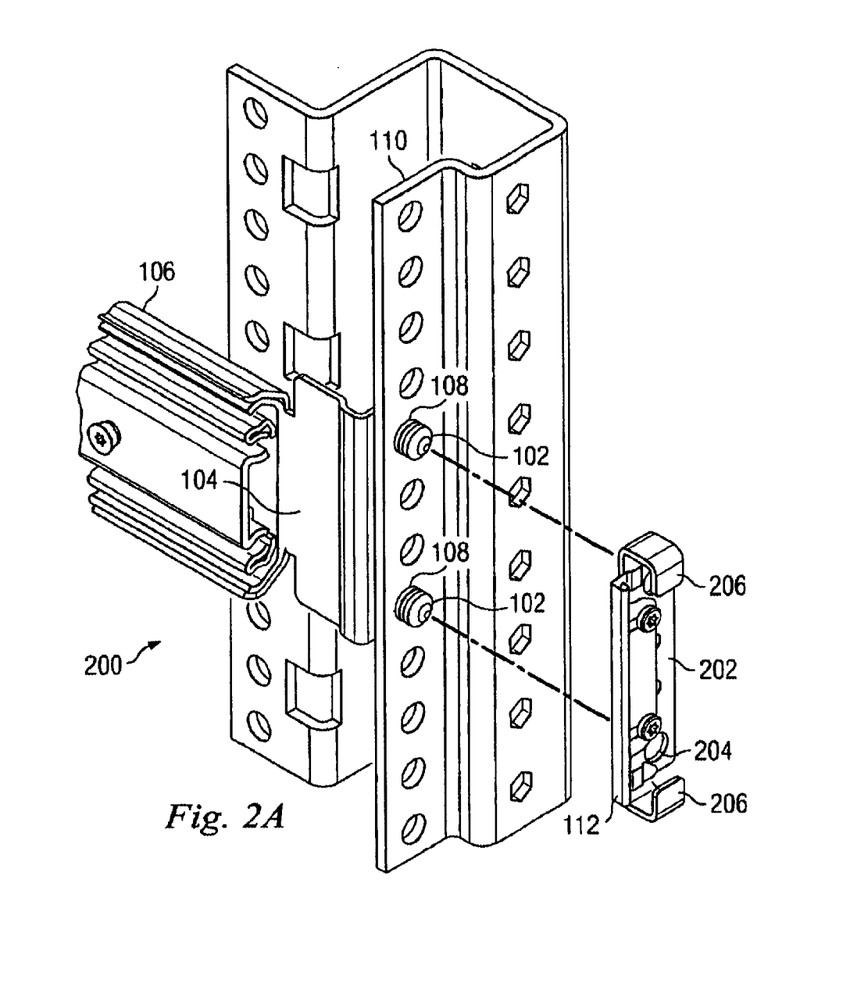
FIGS. 2A and 2B are oblique assembly views illustrating the attachment of a slide rail assembly to a corner post of a rack structure according to a second preferred embodiment of the invention.
Figure 2B:
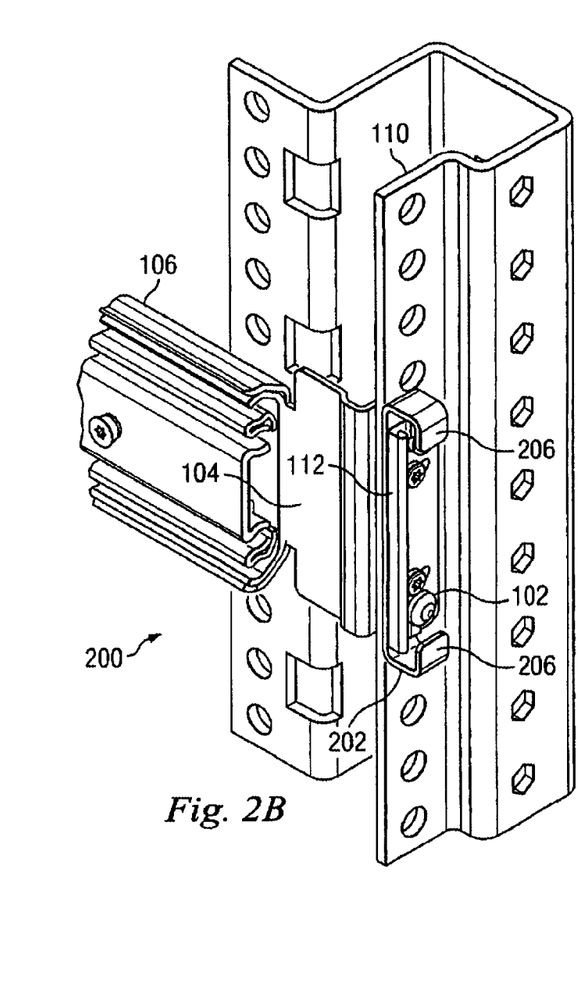

FIGS. 2A and 2B are assembly views illustrating a second preferred embodiment of the invention 200, in which hand-releasable clip 112 is slidingly mounted to a bracket 202. Bracket 202 defines clearance holes 204 for receiving guide bullets 102. The clip 112 may slide, relative to the bracket 202, into an open position (FIG. 2A) and into a closed position (FIG. 2B). When the clip 112 is in the open position, the guide bullet 102 is able to fit through the bracket clearance hole 204 unimpeded by the clip 112. But when the clip 112 is in the closed position, the clip 112 engages the groove of the guide bullet 102.

Bracket 202 may optionally include features for securing a computer enclosure or other piece of electronic equipment in the rack. For example, in the embodiment of FIG. 2, hooks 206 are provided on bracket 202 for engaging a latch on a computer enclosure or the like after the slide rail 106 has been retracted into the rack with the computer enclosure attached.

Figures 3, 4:
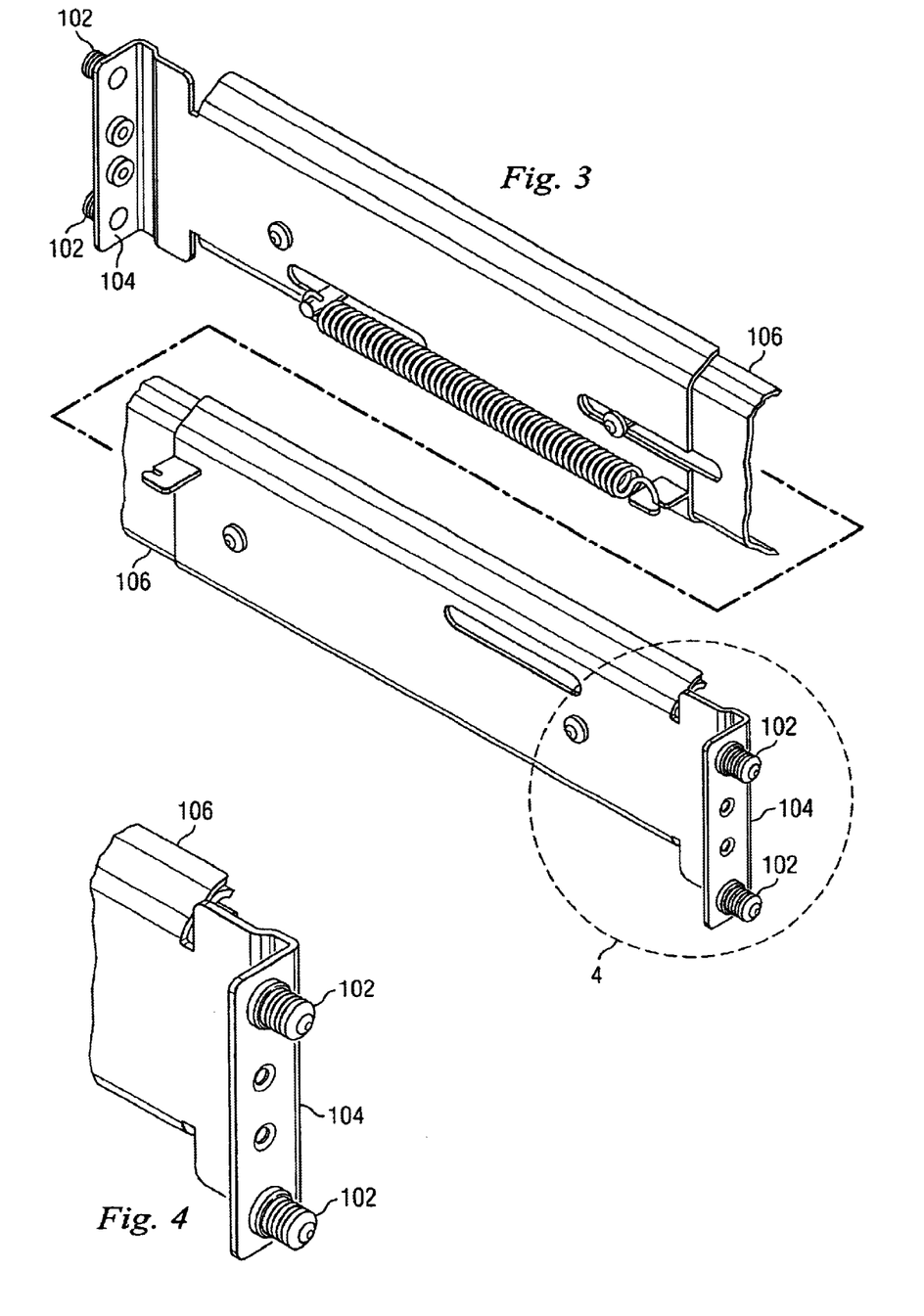
FIG. 3 is an oblique view of the sliding rail assembly of FIGS. 1 and 2.
FIG. 4 is a close-up view of one end of the sliding rail assembly of FIG. 3.
Figure 5:
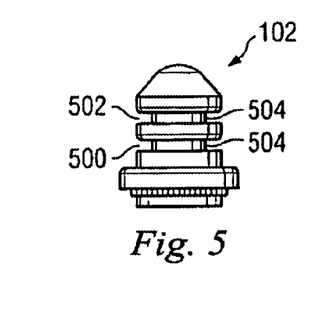
FIGS. 5 and 6 are side and oblique views, respectively, of one of the grooved bullets shown in FIGS. 1–4.
Figure 6:
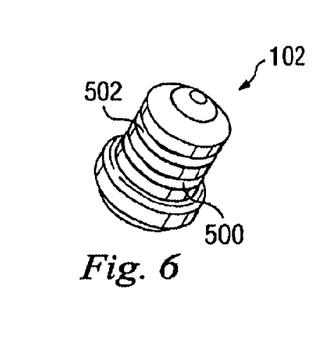
Figure 15:
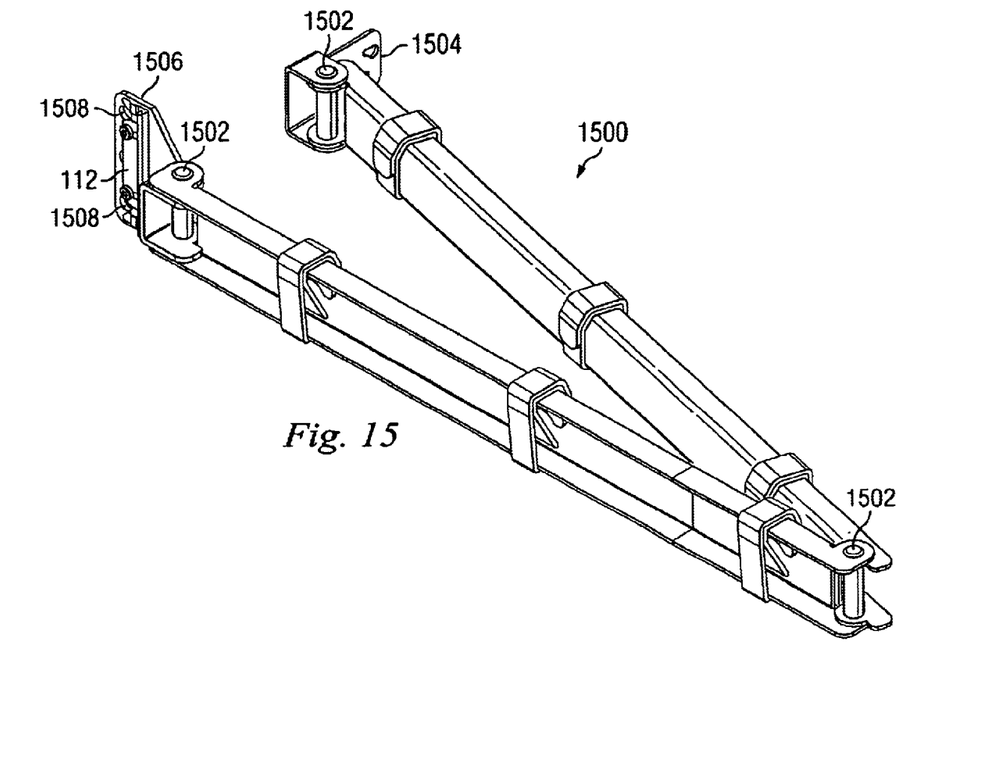
FIG. 15 is an oblique view of a hinged cable management arm according to a preferred embodiment of the invention.
Figure 16:
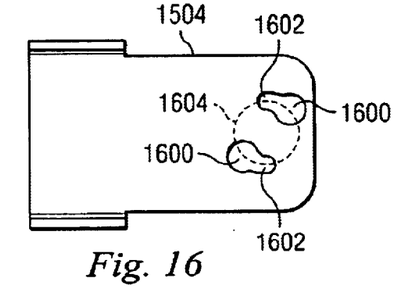
FIG. 16 is a top view of a mounting flange of the hinged cable management arm of FIG. 15.

FIGS. 3 and 4 illustrate slide rail assembly 106 in more detail. As shown, a flange 104 is provided on at least one end of rail assembly 106, and one or more grooved bullets 102 are attached to the flange 104. In the illustrated embodiment, a flange 104 is provided on each end of rail assembly 106, and two bullets 102 are attached to each flange. Bullets 102 may be attached to flange 104 by any conventional means such as, for example, by a threaded fit or by a press-in fit. Each of bullets 102 will preferably define at least one groove 500/502 (FIGS. 5–6) for receiving clip 112. The purpose of optionally having more than one groove in each bullet will become apparent below in the context of discussing cable management arm 1500 (FIG. 15).

Figure 7:
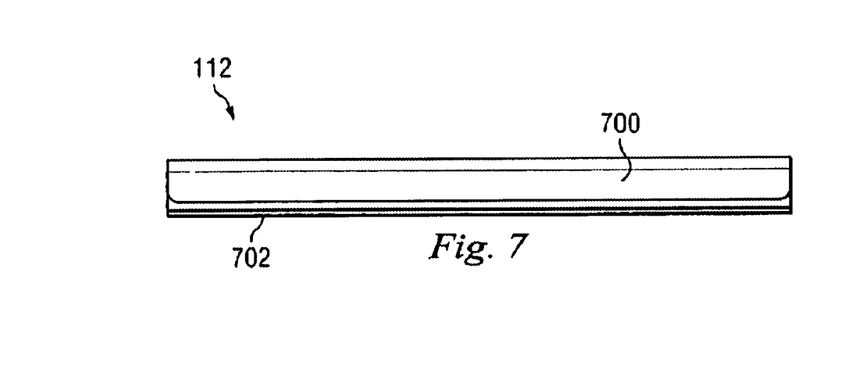
FIGS. 7, 8 and 9 are side, top, and end views, respectively, of the clip shown in FIG. 1.
Figure 8:
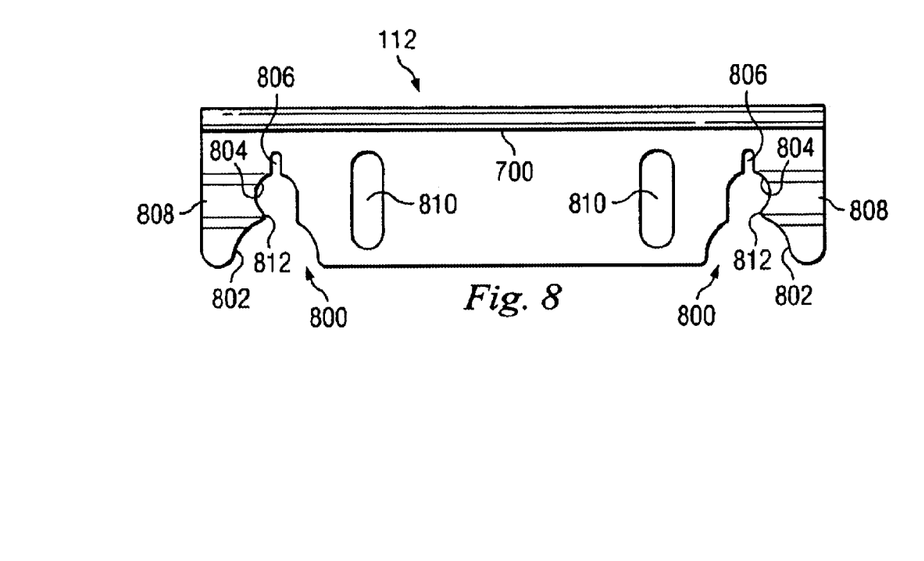
Figure 9:
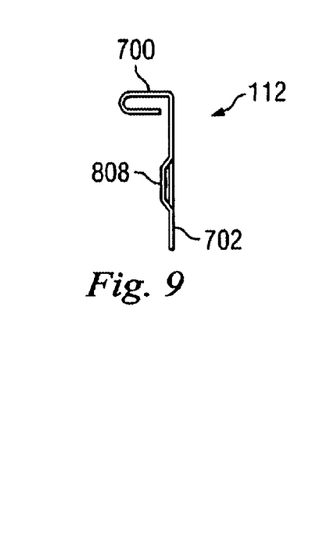
Figure 10:
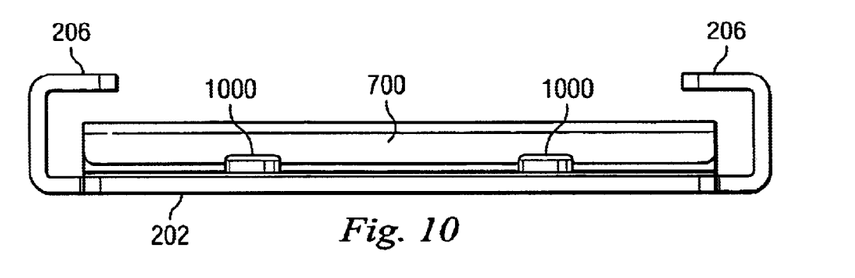
FIGS. 10 and 11 are side and top views, respectively, of the clip-and-bracket assembly shown in FIG. 2.
Figure 11:
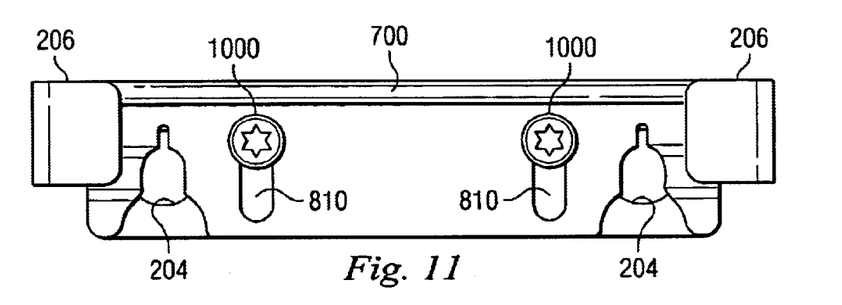
Figure 12:
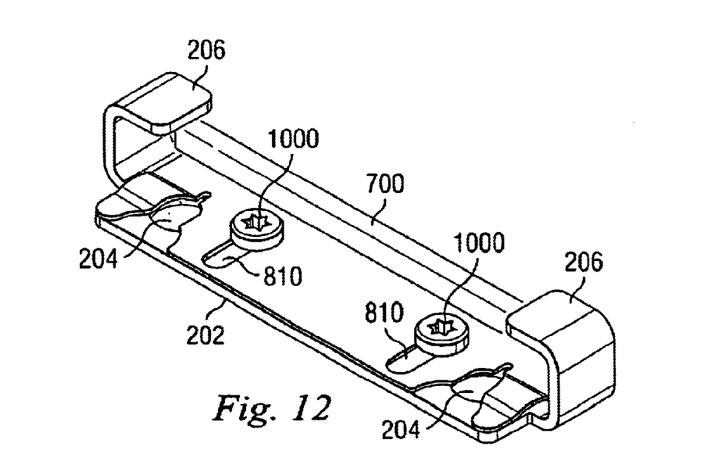
FIGS. 12 and 13 are top and bottom oblique views, respectively, of the clip-and-bracket assembly shown in FIG. 2.
Figure 13:
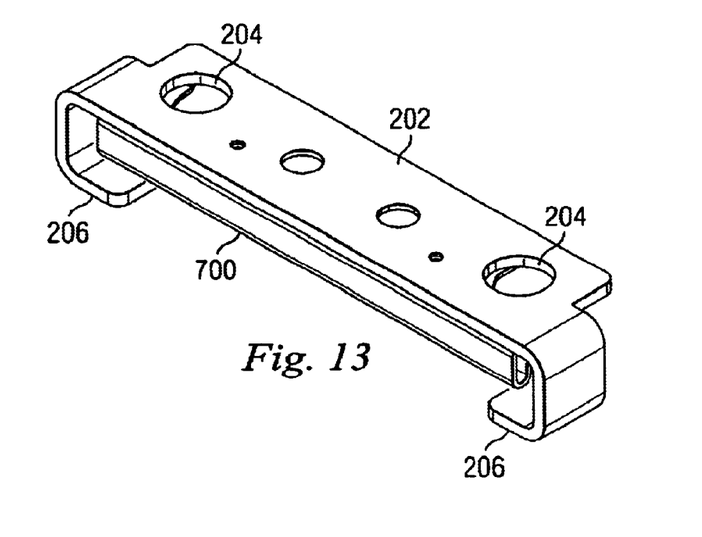

Although clip 112 may take a variety of forms suitable for engaging the groove 500/502 of bullet 102, one preferred form for clip 112 is illustrated in FIGS. 7–9. Clip 112 may be made from any strong but somewhat flexible material, such as thin steel. Clip 112 optionally includes a finger tab 700 to facilitate movement of clip 112 into and out of groove 500/502 by hand. In the embodiment shown, finger tab 700 extends substantially orthogonally away from a sliding surface 702. A slot 800 is provided for receiving bullet 102. In the embodiment shown, slot 800 includes a first portion 802 that is sufficiently wide to clear the outer diameter of bullet 102, and a second portion 804 that is just wide enough to clear the stem 504 of bullet 102.

Figure 21:
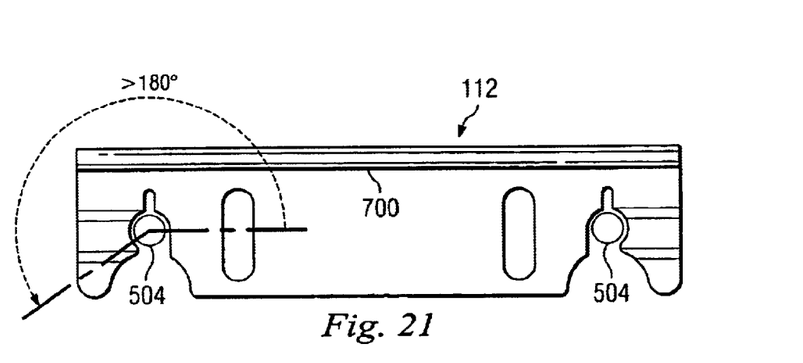
FIG. 21 is a top view of the clip of FIG. 1, illustrating the retention of a standoff stem (shown in cutaway) at one end of a slot in the clip.

Preferably, slot 800 is designed so that it is able to catch and retain stem 504 at one end As shown in FIG. 21, one way of accomplishing this functionality is to design second portion 804 of slot 800 so that it defines an arc greater than 180 degrees at one end. (See detail 812.) In this manner, clip 112 gives a "snap" feedback when engaged with stem 504 and tends to retain bullet 102 better. In addition, part of second portion 804 may be raised as shown in the drawings at 808, and a cutout 806 may be provided in the back of second portion 804. Raised area 808 helps clip 112 to fit snugly inside groove 500/502 by contacting the top of the groove while sliding surface 702 contacts the bottom of the groove. Cutout 806 facilitates an elastic deformation of clip 112 that enables detail 812 to wrap around stem 504 as clip 112 engages bullet 102.

Figure 14:
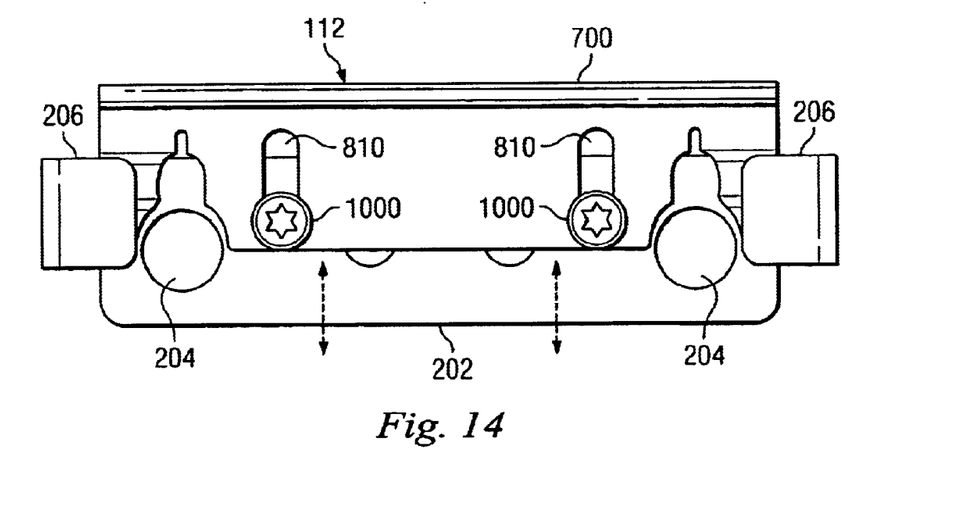
FIG. 14 is a top view of the clip-and-bracket assembly of FIG. 2, shown with the clip in an open position.

Referring now to FIGS. 10–14, the clip-and-bracket assembly of FIG. 2 will now be described in more detail. Clip 112 may be slidingly mounted to bracket 202 by providing parallel slots 810 on clip 112. Screws 1000 pass through slots 810 as shown and engage with threaded holes in bracket 202. Preferably, the heads of screws 1000 should remain slightly elevated from the surface of bracket 202 so as to allow clip 112 to slide freely from the open position shown in FIG. 14 to the closed position shown in FIGS. 10–13. As can be seen in FIG. 14, when clip 112 is in the open position, first portion 802 of slot 600 is aligned with clearance hole 204 so that bullet 102 may pass through bracket 202. But when clip 112 is in the closed position, second portion 804 of slot 800 is able to engage stem 504 of bullet 102.

Figure 17:
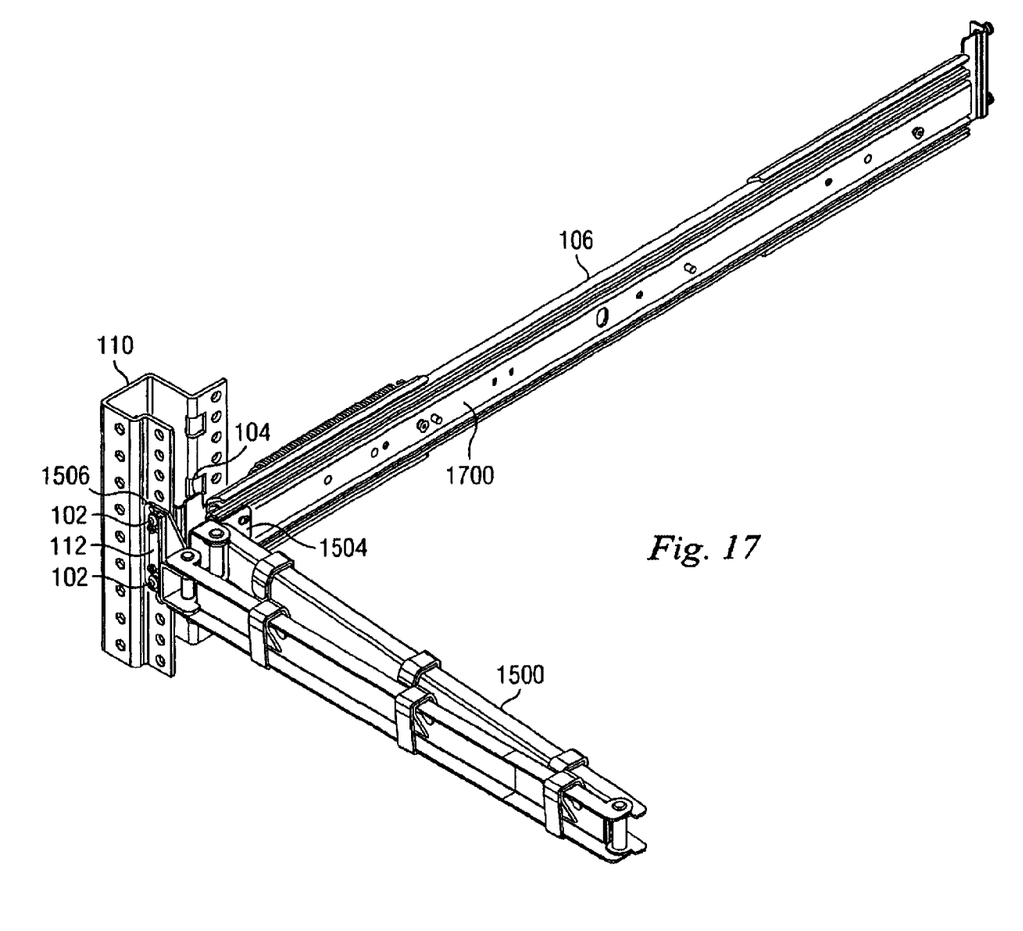
FIG. 17 is an oblique view of the hinged cable management arm of FIG. 15 having been attached to a corner post of a rack structure and to one of the rails of a slide rail assembly according to a preferred embodiment of the invention.
Figure 18:
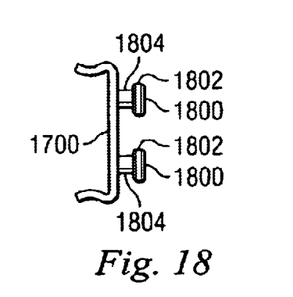
FIG. 18 is an end view of one of the rails of the slide rail assembly shown in FIG. 17.
Figure 19:
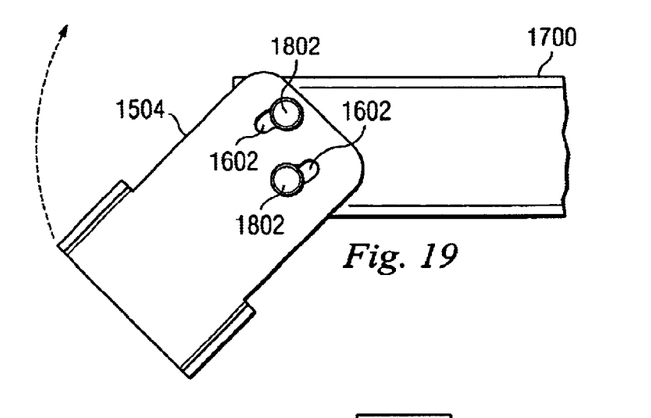
FIGS. 19 and 20 are orthogonal assembly views illustrating the attachment of the mounting flange of FIG. 16 to the inner rail of FIG. 18 according to a preferred embodiment of the invention.
Figure 20:
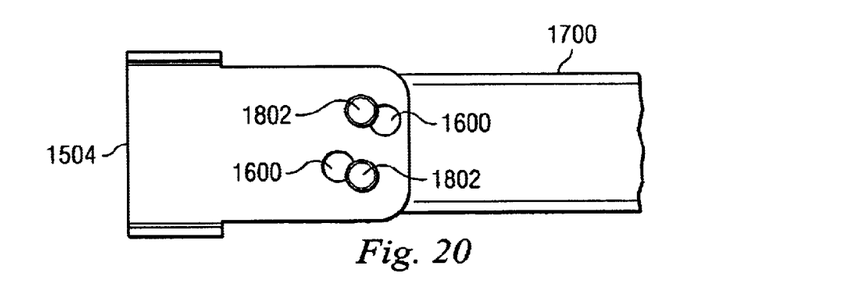
Figure 22:
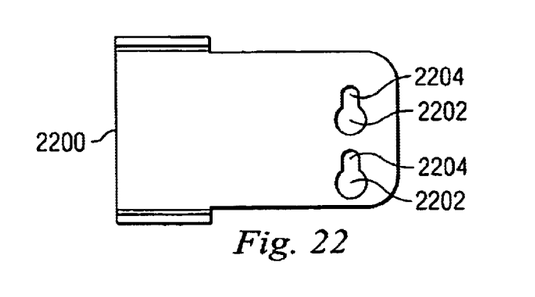
FIG. 22 is an orthogonal view of an alternative preferred embodiment of the cable management arm flange of FIG. 16.

Referring now to FIGS. 15–20, a cable management arm 1500 may also be mounted to the rack without the use of tools. The illustrated arm 1500 includes hinges shown at 1502, and flanges 1504 and 1506. Flange 1504 includes clearance holes 1600, each opening into a curved channel 1602. As shown in FIGS. 17 and 18, standoffs 1800 are attached (by any conventional means) to one of the rails 1700 of slide rail assembly 106. Holes 1600 should be large enough to clear the heads 1802 of standoffs 1800. Channels 1602 should be large enough to clear stems 1804 of standoffs 1800 but not heads 1802. To mount flange 1504 to rail 1700, holes 1600 are slipped over heads 1802 as shown in FIG. 19, and then flange 1504 is rotated relative to rail 1700 so that items 1804 pass along arc 1604 into channels 1602 and come to rest at the ends of channels 1602 as shown in FIG. 20. In this manner, flange 1504 is attached securely to rail 1700 so that is resists relative movement up, down or sideways between the flange and the rail. In an alternative embodiment illustrated in FIG. 22, flange 1504 may be replaced with a flange 2200 having one or more clearance holes 2202 opening into straight channels 2204. Like flange 1504, holes 2202 should clear heads 1802 of standoffs 1800, and channels 2204 should clear stems 1804 but not heads 1802. To mount flange 2200 to rail 1700, holes 2202 are slipped over heads 1802, and then the flange is lowered relative to rail 1700 so that stems 1804 come to rest at the ends of channels 2204.

Flange 1506 may be secured to corner post 110 as shown in FIG. 17. Specifically, flange 104 of slide rail assembly 106 is placed against one side of corner post 110 (as shown) so that bullets 102 protrude through clearance holes 108 in corner post 110. Once bullets 102 are in position, clearance holes 1508 in flange 1506 may be slipped over the bullets as shown. If only one groove 500 is present in bullet 102, then the groove should be disposed far enough from flange 104 so that it is still exposed after flange 1506 is placed over the bullet. If two grooves 500/502 are present on bullet 102, then only groove 502 need be exposed after flange 1506 is in place. Finally, a clip 112 may be engaged with the exposed grooves in bullets 102 as shown. Clip 112 retains bullets 102 in holes 1508, as well as in corner post clearance holes 108, thereby retaining both slide rail assembly 106 and flange 1506 against corner post 110. In the embodiment shown in FIG. 15, clip 112 is slidingly mounted to flange 1506 in the same manner described above with respect to bracket 202. In an alternative embodiment, clip 112 may be loose with respect to flange 1506 as in the embodiment shown in FIG. 1.

Other modifications may also be made to the illustrated embodiments without deviating from the scope of the invention as defined by the following claims and their equivalents.

What is claimed is:

1. Rack mounting apparatus, comprising:
   a bullet having a groove, the bullet being attached to a first flange on one end of a slide rail assembly and having sufficient length to extend through a first clearance hole on a corner post of a rack when the first flange is adjacent the corner post, and the groove being disposed far enough from the first flange that the groove will be disposed on a side of the corner post opposite the first flange when the first flange is adjacent the corner post; and
   a hand-releasable clip adapted to engage the groove on the side of the corner post opposite the first flange and operable when so engaged to retain the bullet in the first clearance hole.

2. Rack mounting apparatus according to claim 1, further comprising a bracket defining a second clearance hole, and wherein:

the hand-releasable clip is mounted to the bracket such that the clip may slide, relative to the bracket, into an open position and into a closed position;

when the clip is in the open position, the bullet is able to extend through the second clearance hole; and when the clip is in the closed position, the clip engages the groove of the bullet.

3. Rack mounting apparatus according to claim 2, wherein the bracket further comprises a feature for securing a piece of electronic equipment in the rack.

4. Rack mounting apparatus according to claim 3, wherein the feature comprises at least one hook for receiving a latch on the piece of electronic equipment.

5. Rack mounting apparatus according to claim 1, further comprising:

a hinged cable management arm having first and second ends a second flange hingedly attached to the arm at the first end; and a first standoff attached to a rail of the slide rail assembly, the first standoff having a stem and a head;

wherein the second flange defines a second clearance hole opening into a channel, the second clearance hole large enough to clear the head, and the channel sufficiently wide to clear the stem but not the head.

6. Rack mounting apparatus according to claim 5:

further comprising a second standoff attached to the rail of the slide rail assembly, the second standoff having a stem and a head;

wherein the second clearance hole is one of two clearance holes opening into curved channels, the two clearance holes are large enough to clear the heads of the standoffs, and the channels are sufficiently wide to clear the stems but not the head; and wherein the curved channels are operable to receive the stems of the standoffs when the second flange is rotated after the heads have passed through the clearance holes.

7. Rack mounting apparatus according to claim 5, wherein the channel is straight.

8. Rack mounting apparatus according to claim 1, further comprising:

a hinged cable management arm having first and second ends; and a second flange hingedly attached to the arm at the second end, wherein the second flange defines a second clearance hole sufficiently large to clear the grooved bullet.

9. Rack mounting apparatus according to claim 8, wherein:

the second flange is adapted to be brought adjacent the side of the corner post opposite the first flange so that the bullet extends through the second clearance hole; and the clip is operable to retain both the first flange and the second flange against the corner post when it is engaged with the groove of the bullet.

10. Rack mounting apparatus according to claim 8, wherein:

the bullet comprises first and second grooves;

the clip engages the first groove if the second flange is not interposed between the clip and the corner post; and the clip engages the second groove if the second flange is interposed between the clip and the corner post.

11. Rack mounting apparatus according to claim 1, wherein the clip comprises a handling tab extending orthogonally away from a sliding surface.

12. Rack mounting apparatus according to claim 1, wherein:

the clip comprises a slot for receiving the bullets.

13. Rack mounting apparatus according to claim 12, wherein:

the slot defines an arc greater than 180 degrees at one end.

14. Rack mounting apparatus according to claim 12, wherein:

the slot is operable to catch the stem at one end of the slot.

15. Rack mounting apparatus according to claim 1, wherein:

the clip comprises a resilient raised portion for engaging the top of the groove while the sliding surface engages the bottom of the groove.

* * * * *

UNITED STATES PATENT AND TRADEMARK OFFICE
CERTIFICATE OF CORRECTION

PATENT NO. : 6,840,388 B2  
APPLICATION NO. : 10/282807  
DATED : January 11, 2005  
INVENTOR(S) : David W. Mayer Page 1 of 1

It is certified that error appears in the above-identified patent and that said Letters Patent is hereby corrected as shown below:

Column 3, line 63, delete "600" and insert therefor --800--

IN THE CLAIMS

Column 5, line 17, after "end" insert --;--

Column 6, line 29, delete "bullets" and insert therefor --bullet--

Signed and Sealed this

Nineteenth Day of June, 2007

JON W. DUDAS  
*Director of the United States Patent and Trademark Office*